United States Patent
Hsu et al.

(10) Patent No.: US 8,829,611 B2
(45) Date of Patent: *Sep. 9, 2014

(54) HIGH VOLTAGE METAL-OXIDE-SEMICONDUCTOR TRANSISTOR DEVICE

(71) Applicant: United Microelectronics Corp., Hsin-Chu (TW)

(72) Inventors: Ming-Shun Hsu, Miaoli County (TW); Ke-Feng Lin, Taipei (TW); Chiu-Te Lee, Hsinchu County (TW); Chih-Chung Wang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/629,608

(22) Filed: Sep. 28, 2012

(65) Prior Publication Data

US 2014/0091389 A1   Apr. 3, 2014

(51) Int. Cl.
*H01L 29/78* (2006.01)

(52) U.S. Cl.
USPC ........................................................ 257/335

(58) Field of Classification Search
USPC ................... 257/288, 335; 438/200
See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |
| 6,326,283 B1 | 12/2001 | Liang | |

(Continued)

*Primary Examiner* — Matthew W Such
*Assistant Examiner* — Warren H Kilpatrick
(74) *Attorney, Agent, or Firm* — Winston Hsu; Scott Margo

(57) ABSTRACT

A high voltage metal-oxide-semiconductor transistor device includes a substrate having an insulating region formed therein, a gate covering a portion of the insulating region and formed on the substrate, a source region and a drain region formed at respective sides of the gate in the substrate, a body region formed in the substrate and partially overlapped by the gate, and a first implant region formed in the substrate underneath the gate and adjacent to the body region. The substrate and body region include a first conductivity type. The source region, the drain region, and the first implant region include a second conductivity type. The first conductivity type and the second conductivity type are complementary to each other.

17 Claims, 3 Drawing Sheets

(56) References Cited

U.S. PATENT DOCUMENTS

| | | |
|---|---|---|
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,700,160 B1 * | 3/2004 | Merchant ............... 257/338 |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2002/0098637 A1 * | 7/2002 | Hossain et al. ............... 438/200 |
| 2002/0171103 A1 * | 11/2002 | Spadea ..................... 257/328 |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0014766 A1 | 1/2011 | Hebert |
| 2011/0057263 A1 | 3/2011 | Tang |
| 2012/0193709 A1 * | 8/2012 | Sukegawa et al. ............ 257/337 |

* cited by examiner

HIGH VOLTAGE METAL-OXIDE-SEMICONDUCTOR TRANSISTOR DEVICE

BACKGROUND OF THE INVENTION

1. Field of the Invention

The invention relates to a high voltage metal-oxide-semiconductor (hereinafter abbreviated as HV MOS) transistor device, and more particularly, to a high voltage lateral double-diffused metal-oxide-semiconductor (HV-LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dopant concentration and large area. The drift region is used to alleviate the high voltage between the drain and the source, therefore the LDMOS transistor device can have higher breakdown voltage (BVD).

It is well-known that characteristics of low $R_{ON}$ and high breakdown voltage are always required to the HV MOS transistor device. However, breakdown voltage and ON-resistance (hereinafter abbreviated as $R_{ON}$) are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a HV MOS transistor device is provided. The HV MOS transistor device includes a substrate having an insulating region formed therein, a gate formed on the substrate and covering a portion of the insulating region, a source and a drain formed at respective sides of the gate in the substrate, a body region formed in the substrate and partially overlapped by the gate, and a first implant region formed in the substrate underneath the gate and adjacent to the body region. The substrate and the body region include a first conductivity type. The source region, the drain region, and the first implant region include a second conductivity type. The first conductivity type and the second conductivity type are complementary to each other.

According to the HV MOS transistor device provided by the present invention, the first implant region formed near the source region in the substrate, which is adjacent to the body region, includes the conductivity type the same with the source region and the drain region. Therefore, resistance in charge accumulation area is reduced and thus $R_{ON}$ is reduced. Consequently, the $R_{ON}$/BVD ratio is desirably lowered.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
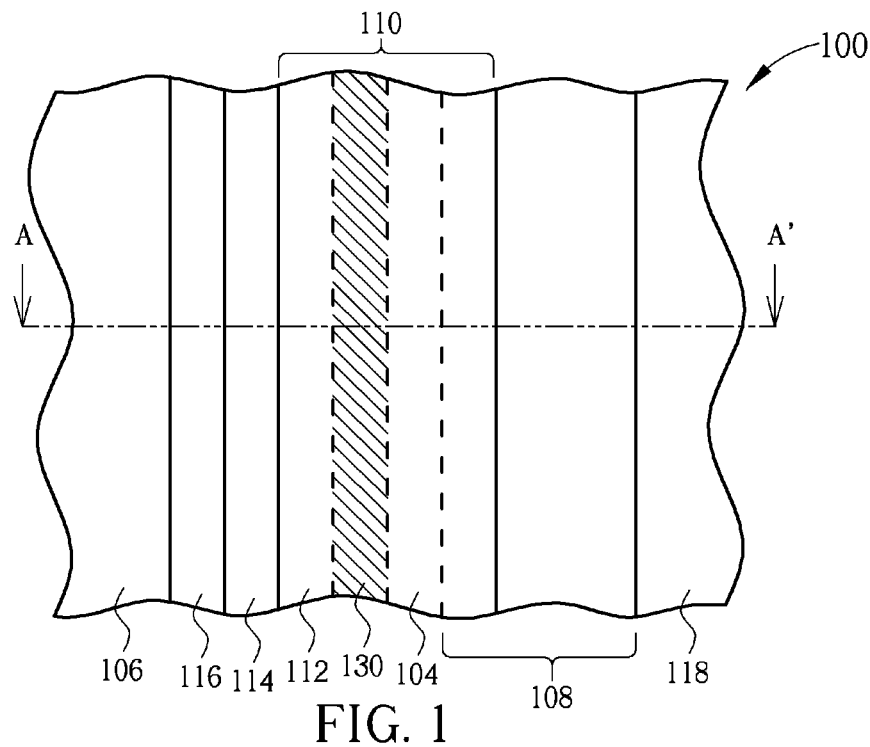
FIG. 1 is a schematic drawing of a portion of a layout pattern of a HV MOS transistor device provided by a first preferred embodiment of the present invention.
Figure 2:
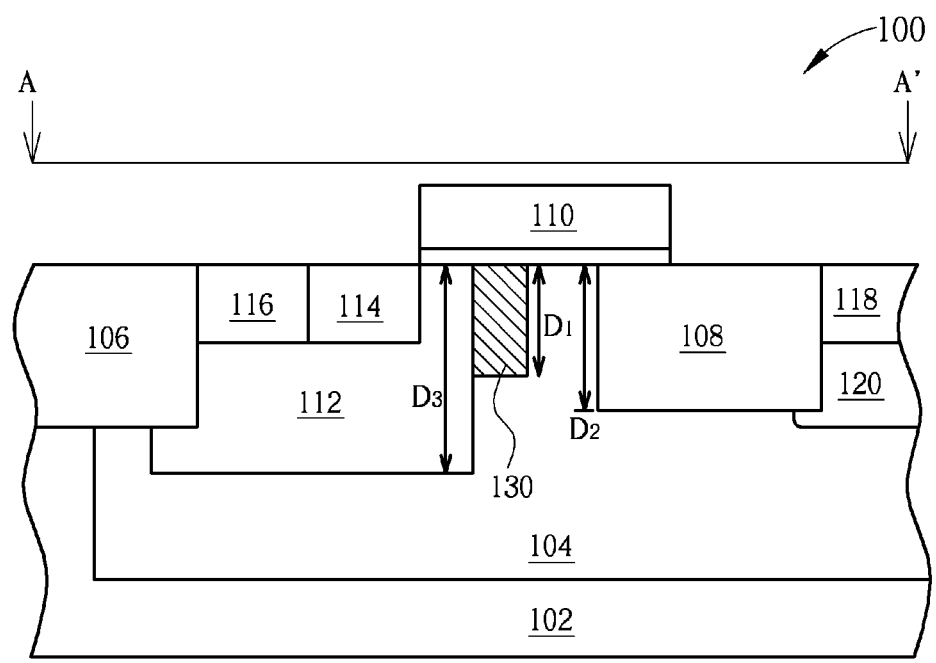
FIG. 2 is a cross-sectional view of the HV MOS transistor device taken along a line A-A' of FIG. 1.

Please refer to FIGS. 1-2, wherein FIG. 1 is a schematic drawing of a portion of a layout pattern of a HV MOS transistor device provided by a first preferred embodiment of the present invention and FIG. 2 is a cross-sectional view of the HV MOS transistor device taken along a line A-A' of FIG. 1. As shown in FIGS. 1-2, a HV MOS transistor device 100 provided by the preferred embodiment is formed on a substrate 102, such as a silicon substrate. The substrate 102 includes a first conductivity type. A deep well region 104 including a second conductivity type is formed in the substrate 102. The first conductivity type and the second conductivity type are complementary to each other. In the preferred embodiment, the first conductivity type is p type and the second conductivity type is n type. A plurality of shallow trench isolations (STIs) 106 for electrically isolating the HV MOS transistor device 100 from other devices and an insulating region 108 are formed in the substrate 102. According to the preferred embodiment, the insulating region 108 includes a STI, but not limited to this. The HV MOS transistor device 100 provided by the preferred embodiment includes a gate 110 formed on the substrate 102 and covering a portion of the insulating region 108. A body region 112 having the first conductivity type is formed in the deep well region 104. Accordingly, the body region 112 is a p-body region. A source region 114 and a drain region 118 are formed at respective sides of the gate 110 in the substrate 102. The source region 114 and the drain region 118 include the second conductivity type, thus are an n-source region and an n-drain region, respectively. As shown in FIG. 2, the n-source region 114 is formed in the p-body region 112. Furthermore, a p-doped region 116 is formed in the p-body region 112. The p-doped region 116 is electrically connected to the n-source region 114. The HV MOS transistor device 100 provided by the preferred embodiment further includes an n-well region 120 (shown in FIG. 2) at the drain side in the deep well region 104. As shown in FIG. 2, the drain region 118 is formed in the n-well region 120.

Please still refer to FIGS. 1-2. More important, the HV MOS transistor device 100 provided by the preferred embodiment includes a first implant region 130 formed in the substrate 102 and adjacent to the body region 112. As shown in FIG. 1, the first implant region 130 includes a continuous implant region in the preferred embodiment, but not limited to this. As shown in FIG. 2, the source region 114 and the first implant region 130 are spaced apart from each other by the body region 112. Furthermore, the first implant region 130 and the insulating region 108 are spaced apart from each other by the deep well region 104. In other words, a space is formed in between the first implant region 130 and the insulating region 108, thus the first implant region 130 is prevented from contacting the insulating region 108. A depth $D_1$ of the first implant region 130 is smaller than a depth $D_2$ of the insulating region 108 and a depth $D_3$ of the body region 112. As shown in FIG. 2, the gate 110 covers the first implant region 130 entirely. The first implant region 130 includes the second conductivity type and thus is an n-typed implant region. A dopant concentration of the first implant region 130 is larger than a dopant concentration of the deep well region 104, and a dopant concentration of the source region 114 and the drain region 118 is larger than the dopant concentration of the first implant region 130.

According to the HV MOS transistor device 100 provided by the first preferred embodiment, the first implant region 130 formed in the substrate 102 under the gate 110 is adjacent to the body region 112 but spaced apart from the source region 114. Since the first implant region 130 includes the second conductivity type that is the same with the source region 114 and the drain region 118, resistance in charge accumulation area is reduced and thus $R_{ON}$ is reduced. Consequently, the $R_{ON}$/BVD ratio is desirably lowered.

Figure 3:
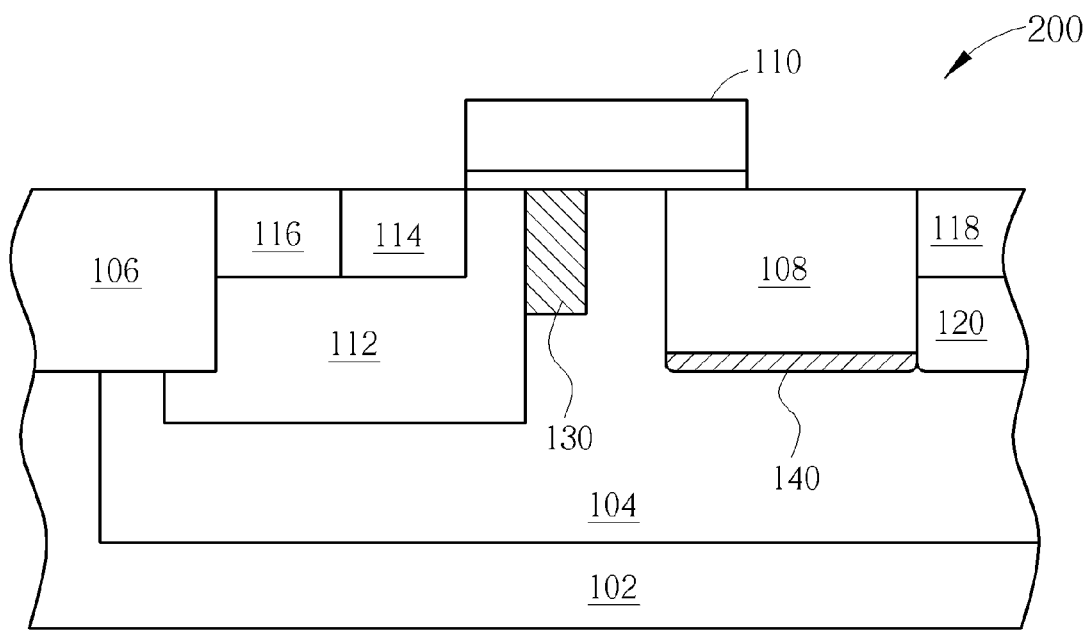
FIG. 3 is a cross-sectional view of a HV MOS transistor device provided by a second preferred embodiment of the present invention.

Please refer to FIG. 3, which is a cross-sectional view of a HV MOS transistor device provided by a second preferred embodiment of the present invention. It is noteworthy that elements the same in both of the first and second embodiments are designated by the same numerals, and details such as material choice and conductivity types concerning those elements are omitted in the interest of brevity. The difference between the first preferred embodiment and the second preferred embodiment is: The HV MOS transistor device 100 provided by the second preferred embodiment further includes a second implant region 140 formed under the insulating region 108, and the insulating region 108 covers the second implant region 140 entirely. The second implant region 140 includes the first conductivity type and thus is a p-typed implant region. According to the preferred embodiment, the second implant region 140 is a continuous implant region, but not limited to this. For example, the second implant region 140 also can be a non-continuous implant region extending along a direction parallel with an extending direction of the insulating region 108 and interrupted by the deep well region 104. A plurality of implant regions are even allowed to interrupt the non-continuous second implant region 140.

According to the HV MOS transistor device 100 provided by the second preferred embodiment, the second implant region 140 having the conductivity type complementary to the source region 114 and the drain region 118 is formed under the insulating region 108. The second implant region 140 provides a reduced surface field (RESURF) effect, therefore the breakdown voltage of the HV MOS transistor device 100 is efficaciously improved. In the same time, the first implant region 130 formed in the substrate 102 under the gate 110 is adjacent to the body region 112 but spaced apart from the source region 114 in preferred embodiment. As mentioned above, since the first implant region 130 includes the second conductivity type that is the same with the source region 114 and the drain region 118, resistance in the charge accumulation area is reduced and thus $R_{ON}$ is reduced. Consequently, the breakdown voltage is improved while the $R_{ON}$ is reduced according to the second preferred embodiment, and thus the $R_{ON}$/BVD ratio is further lowered.

Figure 4:
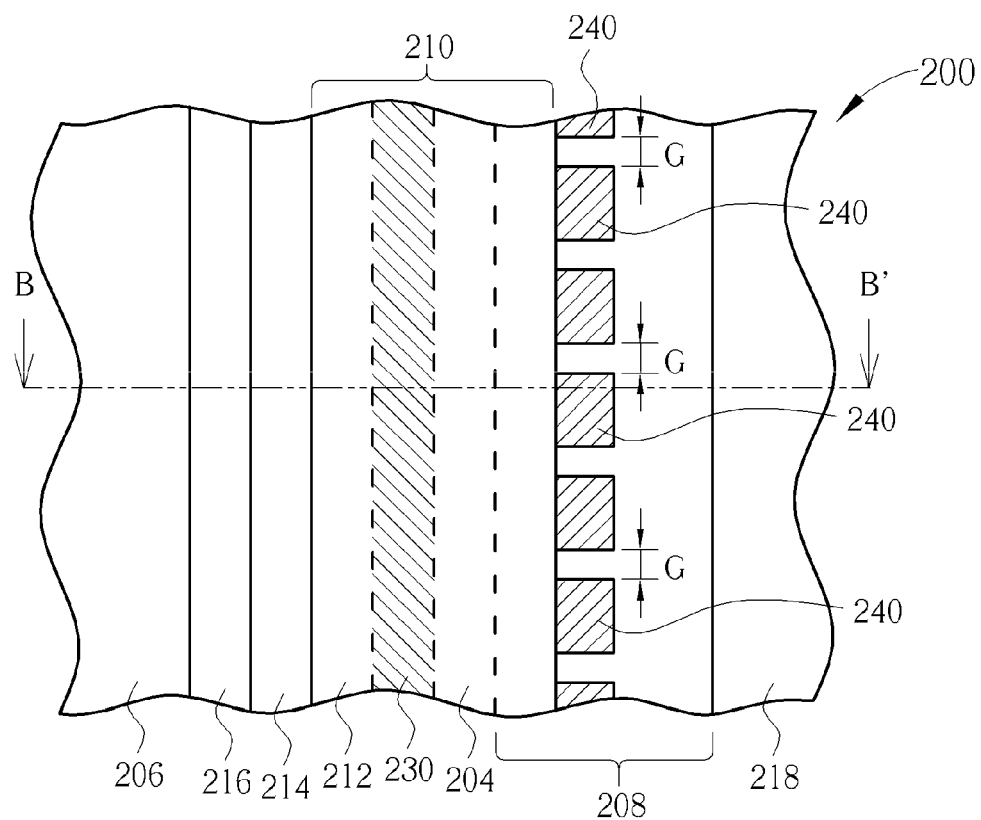
FIG. 4 is a schematic drawing of a portion of a layout pattern of a HV MOS transistor device provided by a third preferred embodiment of the present invention.
Figure 5:
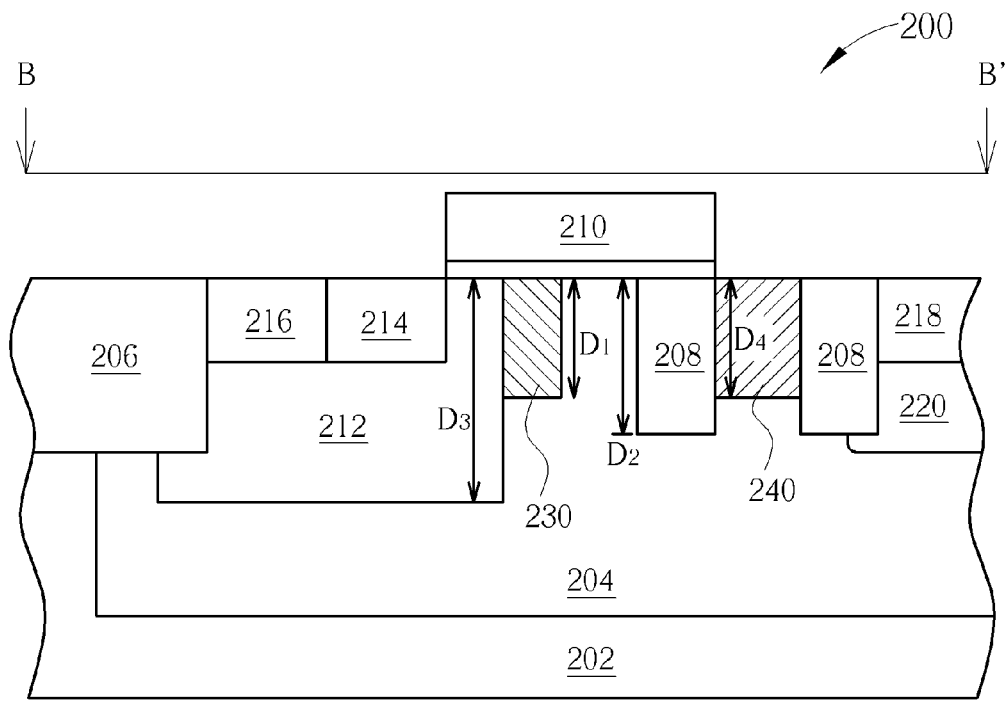
FIG. 5 is a cross-sectional view of the HV MOS transistor device taken along a line B-B' of FIG. 4.

Please refer to FIGS. 4-5, wherein FIG. 4 is a schematic drawing of a portion of a layout pattern of a HV MOS transistor device provided by a third preferred embodiment of the present invention and FIG. 5 is a cross-sectional view of the HV MOS transistor device taken along a line B-B' of FIG. 4. It is noteworthy that elements the same in the first, second and third embodiments are designated by the same numerals, and details such as material choice and conductivity types concerning those elements are also omitted in the interest of brevity. As shown in FIGS. 4-5, the HV MOS transistor device 200 provided by the third preferred embodiment is formed on a substrate 202. A deep well region 204 is formed in the substrate 202. A plurality of STIs 206 for electrically isolating the HV MOS transistor device 200 from other devices and an insulating region 208 are formed in the substrate 202. The HV MOS transistor device 200 provided by the preferred embodiment includes a gate 210 formed on the substrate 202 and covering a portion of the insulating region 208. A body region 212 is formed in the deep well region 204. A source region 214 and a drain region 218 are formed at respective sides of the gate 210 in the deep well region 204 in the substrate 202. As shown in FIG. 5, the n-source region 214 is formed in the p-body region 212. Furthermore, a p-doped region 216 is formed in the p-body region 212 and electrically connected to the n-source region 214. The HV MOS transistor device 200 provided by the preferred embodiment further includes an n-well region 220 (shown in FIG. 5) at the drain side in the deep well region 204. As shown in FIG. 5, the drain region 218 is formed in the n-well region 220.

Please refer to FIGS. 4-5 again. More important, the HV MOS transistor device 200 provided by the preferred embodiment includes a first implant region 230 formed in the substrate 202 and adjacent to the body region 212. As shown in FIG. 4, the first implant region 230 includes a continuous implant region in the preferred embodiment, but not limited to this. As shown in FIG. 5, the source region 214 and the first implant region 230 are spaced apart from each other by the body region 212. Furthermore, the first implant region 230 and the insulating region 208 are spaced apart from each other by the deep well region 204. In other words, a space is formed in between the first implant region 230 and the insulating region 208, thus the first implant region 230 is prevented from contacting the insulating region 208. A depth $D_1$ of the first implant region 230 is smaller than a depth $D_2$ of the insulating region 208 and a depth $D_3$ of the body region 212. As shown in FIG. 5, the gate 210 covers the first implant region 230 entirely. The first implant region 230 includes the second conductivity type and thus is an n-typed implant region. A dopant concentration of the first implant region 230 is larger than a dopant concentration of the deep well region 204, and a dopant concentration of the source region 214 and the drain region 218 is larger than the dopant concentration of the first implant region 230.

Please still refer to FIGS. 4-5. According to the third preferred embodiment, the HV MOS transistor device 200 further includes a plurality of second implant regions 240 formed in the substrate 202. The insulating region 208 surrounds the second implant regions 240 as shown in FIGS. 4-5. A depth $D_4$ of the second implant regions 240 is smaller than the depth $D_2$ of the insulating region 208. Consequently, the second implant regions 240 is taken as to be formed in the insulating region 208 and the insulating region 208 isolates the second implant regions 240 from each other. Thus, a gap G is formed in between any two adjacent second implant regions 240 according to the preferred embodiment. As mentioned above, the second implant regions 240 include the first conductivity type and thus are p-typed implant regions.

According to the HV MOS transistor device 200 provided by the third preferred embodiment, the second implant regions 240 having the conductivity type complementary to the source region 214 and the drain region 218 are formed under the insulating region 208. The second implant regions 240 provide a RESURF effect, therefore the breakdown voltage of the HV MOS transistor device 200 is efficaciously improved. Additionally, since the second implant regions 240 are formed in the insulating region 208 and the depth $D_4$ of the second implant regions 240 is smaller than the depth $D_2$ of the insulating region 208, current path is shortened, and thus $R_{ON}$ is reduced. In the same time, the first implant region 230 formed in the substrate 102 under the gate 210 is adjacent to the body region 212 but spaced apart from the source region 214 in preferred embodiment. As mentioned above, since the first implant region 230 includes the second conductivity type that is the same with the source region 214 and the drain region 218, resistance in the charge accumulation area is reduced and thus $R_{ON}$ is further reduced. Consequently, the breakdown voltage is improved while the $R_{ON}$ is further reduced according to the third preferred embodiment, and thus the $R_{ON}$/BVD ratio is even further lowered.

Figure 6:
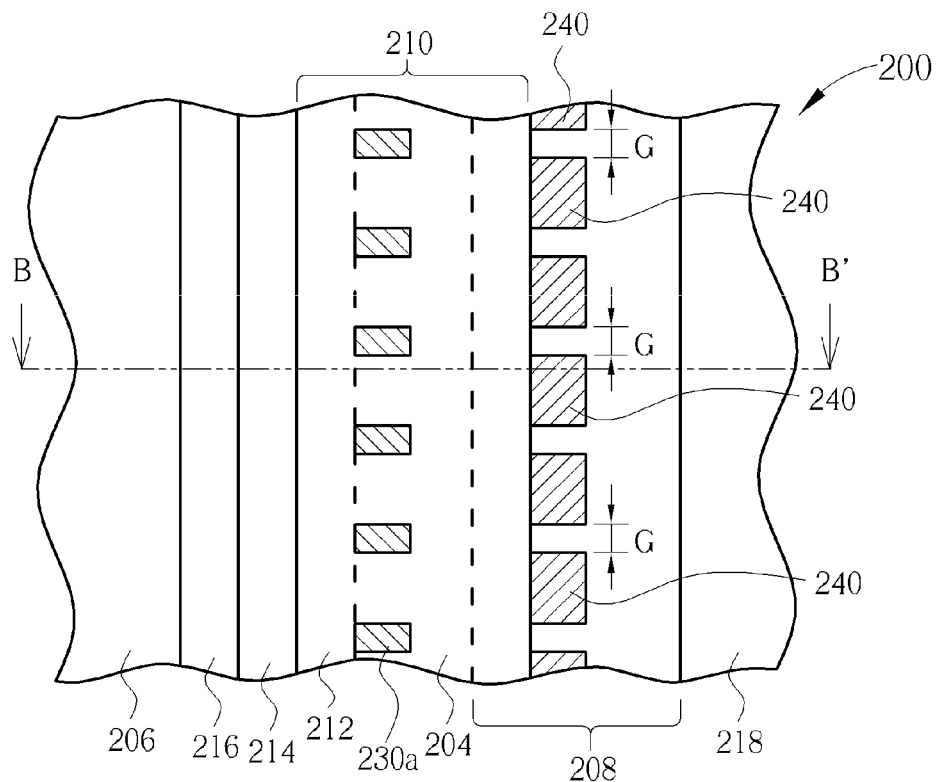
FIG. 6 is a schematic drawing of a portion of a layout pattern of a HV MOS transistor device provided by a fourth preferred embodiment of the present invention.

Please refer to FIG. 6, which is a schematic drawing of a portion of a layout pattern of a HV MOS transistor device provided by a fourth preferred embodiment of the present invention. It is noteworthy that elements the same in the aforementioned embodiments and the fourth embodiments are designated by the same numerals, and details such as material choice and conductivity types concerning those elements are also omitted in the interest of brevity. The difference between the third preferred embodiment and the fourth preferred embodiment is: The first implant region 230 includes a plurality of islanding first implant regions 230a and each of the islanding first implant regions 230a is formed corresponding to the gap G in between the two adjacent second implant regions 240 as shown in FIG. 6.

According to the HV MOS transistor device 200 provided by the fourth preferred embodiment, the second implant regions 240 provide a RESURF effect, therefore the breakdown voltage of the HV MOS transistor device 200 is efficaciously improved. As mentioned above, since the second implant regions 240 are formed in the insulating region 208 and the depth $D_4$ of the second implant regions 240 is smaller than the depth $D_2$ of the insulating region 208, current path is shortened, and thus $R_{ON}$ is reduced. In the same time, the islanding first implant regions 230a formed in the substrate 102 under the gate 210 are adjacent to the body region 212 but spaced apart from the source region 214 in preferred embodiment. As mentioned above, since the islanding first implant regions 230a include the second conductivity type that is the same with the source region 214 and the drain region 218, resistance in the charge accumulation area is reduced and thus $R_{ON}$ is further reduced. Consequently, the breakdown voltage is improved while the $R_{ON}$ is further reduced according to the fourth preferred embodiment, and thus the $R_{ON}$/BVD ratio is even further lowered.

According to the HV MOS transistor device provided by the present invention, the first implant region formed near the source region in the substrate, which is adjacent to the body region, includes the conductivity type the same with the source region and the drain region. Therefore, resistance in charge accumulation area is reduced and thus $R_{ON}$ is reduced. Consequently, the $R_{ON}$/BVD ratio is desirably lowered. Furthermore, by forming the second implant region(s) having the conductivity type complementary to the source/drain, the breakdown voltage is improved while the $R_{ON}$ is reduced, and thus the $R_{ON}$/BVD ratio is further lowered.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage metal-oxide-semiconductor (HV MOS) transistor device, comprising:
   a substrate having a first conductivity type, the substrate comprising an insulating region formed therein;
   a gate formed on the substrate and covering a portion of the insulating region;
   a source region and a drain region formed at respective sides of the gate in the substrate, the source region and the drain region having a second conductivity type being complementary to the first conductivity type;
   a deep well region formed in the substrate;
   a body region formed in the substrate and partially overlapped by the gate, the body region having the first conductivity type; and
   a first implant region formed in the substrate underneath the gate and adjacent to the body region, the first implant region having the second conductivity type, wherein the first implant region and the insulating region are spaced apart from each other by the deep well region.

2. The HV MOS transistor device according to claim 1, wherein the gate covers the first implant region entirely.

3. The HV MOS transistor device according to claim 1, wherein the source region is formed in the body region.

4. The HV MOS transistor device according to claim 3, wherein the source region and the first implant region are spaced apart from each other by the body region.

5. The HV MOS transistor device according to claim 1, wherein the deep well region having the second conductivity type.

6. The HV MOS transistor device according to claim 1, wherein the body region, the source region, the drain region, and the first implant region are all formed in the deep well region.

7. The HV MOS transistor device according to claim 5, wherein a dopant concentration of the first implant region is larger than dopant concentration of the deep well region, and a dopant concentration of the source region and the drain region is larger than the dopant concentration of the first implant region.

8. The HV MOS transistor device according to claim 1, further comprising a second implant region formed in the substrate under the insulating region, and the second implant region comprising the first conductivity type.

9. The HV MOS transistor device according to claim 8, wherein the insulating region covers the second implant region entirely.

10. The HV MOS transistor device according to claim 1, further comprising a plurality of second implant regions formed in the substrate and surrounded by the insulating region.

11. The HV MOS transistor device according to claim 10, wherein the second implant regions comprise the first conductivity type and the insulating region isolates the second implant regions from each other.

12. The HV MOS transistor device according to claim 11, wherein a depth of the second implant regions is smaller than a depth of the insulating region.

13. The HV MOS transistor device according to claim 10, wherein the first implant region comprises a continuous first implant region.

14. The HV MOS transistor device according to claim 10, wherein the first implant region comprises a plurality of islanding first implant regions.

15. The HV MOS transistor device according to claim 14, wherein the islanding first implant regions are formed corresponding to a gap formed in between two adjacent second implant regions, respectively.

16. The HV MOS transistor device according to claim 1, wherein the first implant region comprises a continuous first implant region.

17. The HV MOS transistor device according to claim 1, wherein a depth of the first implant region is smaller than a depth of the insulating region and a depth of the body region.

* * * * *